US011553266B2

(12) United States Patent
Asai et al.

(10) Patent No.: US 11,553,266 B2
(45) Date of Patent: Jan. 10, 2023

(54) MICROPHONE SYSTEM

(71) Applicant: SHARP KABUSHIKI KAISHA, Sakai (JP)

(72) Inventors: Junki Asai, Sakai (JP); Tetsuji Togoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 316 days.

(21) Appl. No.: 17/072,441

(22) Filed: Oct. 16, 2020

(65) Prior Publication Data

US 2021/0120325 A1 Apr. 22, 2021

(30) Foreign Application Priority Data

Oct. 21, 2019 (JP) .............................. JP2019-191615

(51) Int. Cl.
H04R 1/08 (2006.01)
H03M 1/12 (2006.01)
H02M 3/06 (2006.01)
H03M 1/66 (2006.01)

(52) U.S. Cl.
CPC ................ H04R 1/08 (2013.01); H02M 3/06 (2013.01); H03M 1/12 (2013.01); H03M 1/66 (2013.01); H04R 2420/07 (2013.01)

(58) Field of Classification Search
CPC ........................................................ H04R 1/08
See application file for complete search history.

(56) References Cited

FOREIGN PATENT DOCUMENTS

CN 207926899 U 9/2018
JP H04-42566 A 2/1992

Primary Examiner — Olisa Anwah
(74) Attorney, Agent, or Firm — ScienBiziP, P.C.

(57) ABSTRACT

A microphone system includes: a microphone including a microphone output terminal and a microphone GND terminal, the microphone being configured to output, as an input sound signal, a voltage signal exhibiting a change in voltage between the microphone output terminal and the microphone GND terminal depending on an input sound; an A/D converting unit mounted on a first circuit board and configured to perform digital conversion on the input sound signal that is input; and a power supply circuit mounted on a second circuit board connected to the first circuit board via a pair of power supply lines, and configured to feed DC power to the A/D converting unit via the pair of power supply lines. The microphone outputs the input sound signal to the A/D converting unit via a pair of first signal lines different from the pair of power supply lines.

7 Claims, 4 Drawing Sheets

MICROPHONE SYSTEM

CROSS-REFERENCE TO RELATED APPLICATION

The present application claims priority from Japanese Application JP2019-191615, the content to which is hereby incorporated by reference into this application.

BACKGROUND OF THE INVENTION

1. Field of the Invention

The disclosure relates to a microphone system.

2. Description of the Related Art

In the related art, a semiconductor integrated circuit is disclosed in which a digital circuit portion and an analog circuit portion are mixed (see, for example, JP H04-42566 A).

In JP H04-42566 A, for reducing noise generation in the digital circuit portion and preventing degradation of the characteristics of the analog circuit portion (A/D converting unit), a power supply line of the digital circuit portion is separated from a power supply line of the analog circuit portion to allow the digital circuit portion to be fed with a power supply voltage lower than that for the analog circuit portion.

SUMMARY OF THE INVENTION

However, in JP H04-42566 A, a circuit GND is commonly used for the analog circuit portion and the digital circuit portion, and hence noise in the digital circuit portion may be transmitted to the analog circuit portion via the circuit GND, leading to degraded characteristics of the analog circuit portion.

A main object of one aspect of the present disclosure is to provide a microphone system that can improve sound quality.

A microphone system according to an aspect of the present disclosure includes a microphone, an A/D converting unit, and a power supply circuit.

The microphone includes a microphone output terminal and a microphone GND terminal. The microphone outputs, as an input sound signal, a voltage signal exhibiting a change in voltage between the microphone output terminal and the microphone GND terminal depending on an input sound. The A/D converting unit is mounted on a first circuit board. The A/D converting unit is configured to perform digital conversion on the input sound signal that is input. The power supply circuit is mounted on a second circuit board. The second circuit board is connected to the first circuit board via a pair of power supply lines. The power supply circuit supplies direct current (DC) power to the A/D converting unit via the pair of power supply lines. The microphone is configured to output the input sound signal to the A/D converting unit via a pair of first signal lines different from the pair of power supply lines.

DETAILED DESCRIPTION OF THE INVENTION

Embodiments and modifications described below are merely examples of the disclosure, and the disclosure is not limited to the embodiments and modifications. Besides the embodiments and modifications, various changes are possible depending on the design and the like, unless the changes deviate from the technical concept of the disclosure.

Embodiments (1) Overview

Figure 1:
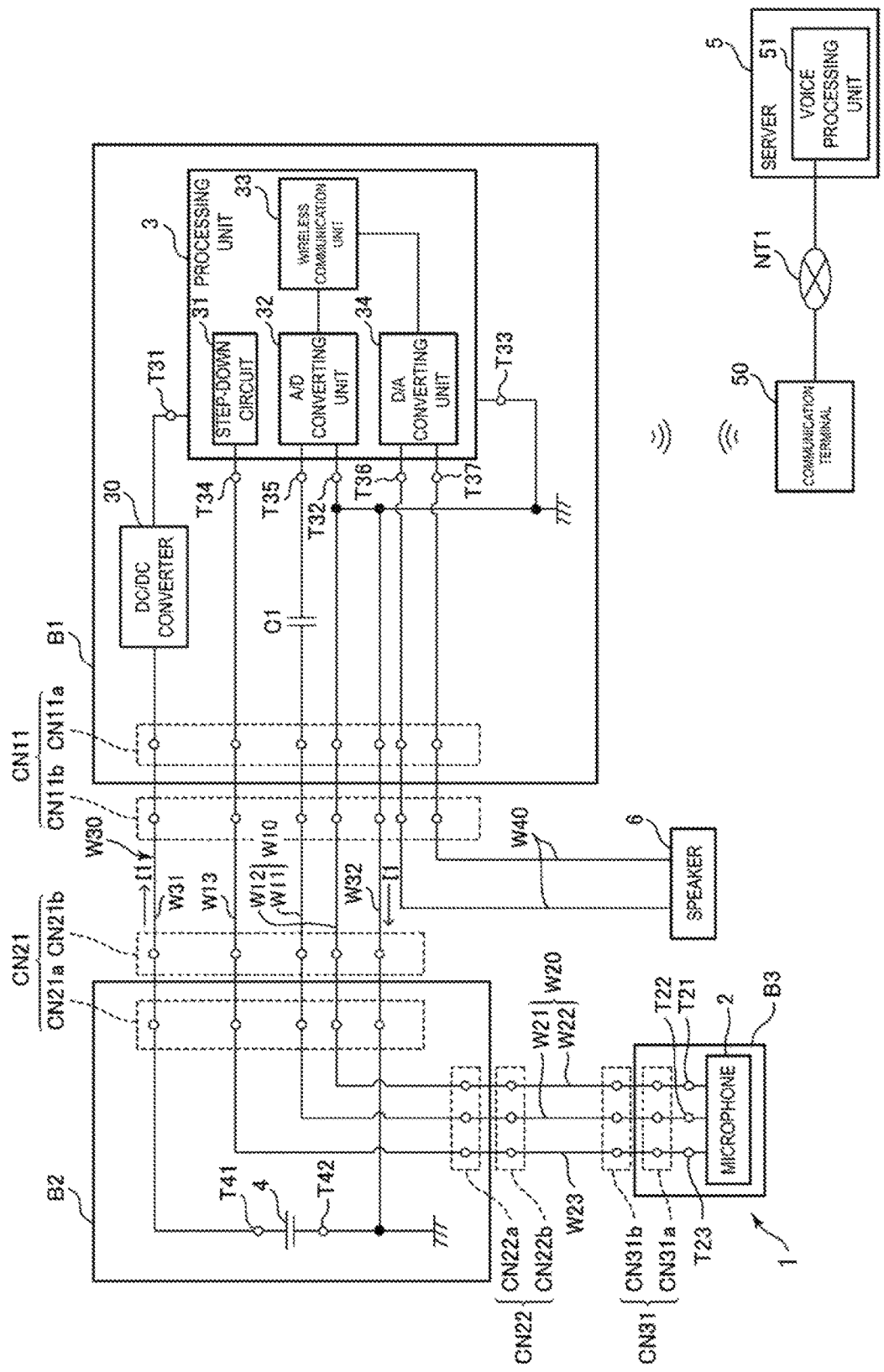
FIG. 1 is a block diagram of a microphone system according to an embodiment.
Figure 2:
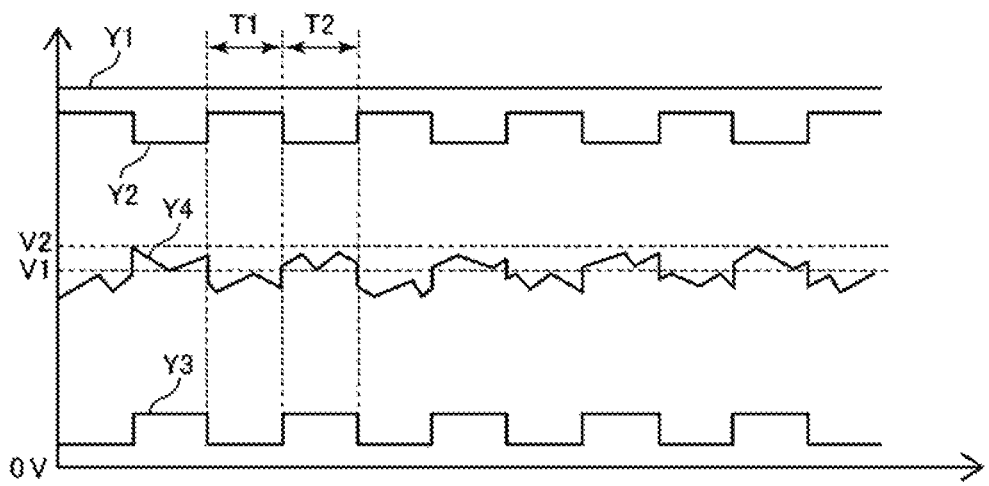
FIG. 2 is an operational waveform diagram of the microphone system in FIG. 1.

A microphone system 1 according to the present embodiment will be described with reference to FIG. 1 and FIG. 2. FIG. 1 is a block diagram of the microphone system 1 according to the present embodiment. FIG. 2 is an operational waveform diagram of the microphone system 1 according to the present embodiment.

The microphone system 1 of the present embodiment is used, for example, in home appliances. Home appliances include, for example, refrigerators, microwave ovens, air conditioners, air purifiers, washing machines, and rice cookers. The microphone system 1 obtains sound (e.g., voice) emitted by a user and converts the obtained sound into sound data. The sound data is transmitted by a wireless communication unit 33 as a wireless signal. A voice processing unit 51 receives the sound data via a communication terminal 50 or similar apparatus, and performs voice recognition processing on the sound data. A control unit of the home appliance performs control in accordance with a voice recognition result from the voice processing unit 51. In other words, the microphone system 1 is used for a Voice User Interface (VUI) of a voice control system of the home appliance. Note that applications of the microphone system 1 are not limited to the voice control system of the home appliance, and other applications are possible (e.g., smart speaker systems, recording systems, and specific sound sensing systems).

A microphone 2 of the microphone system 1 is preferably located at a position of the home appliance at which the user's voice is easy to acquire. The wireless communication unit 33, which transmits a wireless signal including sound data, is preferably disposed at a position of the home appliance that has a favorable wireless communication environment. A power supply circuit 4 that feeds power to the wireless communication unit 33 or the like is preferably located at a position of the home appliance that has free space. In this way, components of the home appliance may be difficult to mount together on one circuit board because the components have different arrangement locations suitable for the functions of each component. However, when a plurality of components are separately mounted on a plurality of circuit boards, a potential difference in circuit GND may occur among the circuit boards due to, for example, the resistance of wiring connecting the circuit boards together (wiring resistance). In the microphone system 1 of the present embodiment, even with a potential difference in the circuit GND, noise in sound input signals can be suppressed to improve sound quality.

The microphone system 1 of the present embodiment includes the microphone 2, an A/D converting unit 32, and the power supply circuit 4.

The microphone 2 includes a microphone output terminal T21 and a microphone GND terminal T22. The microphone 2 outputs, as an input sound signal, a voltage signal exhibiting a change in the voltage between the microphone output terminal T21 and the microphone GND terminal T22 depending on an input sound.

The A/D converting unit 32 is mounted on a first circuit board B1. The A/D converting unit 32 performs digital conversion on the input sound signal that is input.

The power supply circuit 4 is mounted on a second circuit board B2. The second circuit board B2 is connected to the first circuit board B1 via a pair of power supply lines W30. The power supply circuit 4 supplies DC power to the A/D converting unit 32 via the pair of power supply lines W30.

The microphone 2 outputs the input sound signal to the A/D converting unit 32 via a pair of first signal lines W10 different from the pair of power supply lines W30.

In the microphone system 1 of the present embodiment, a signal path for the input sound signal is separated from a power supply path. Thus, even in a case where a potential difference occurs in the circuit GND between the first circuit board B1 and the second circuit board B2 due to wiring resistance, noise of the input sound signal caused by the potential difference in the circuit GND can be suppressed, and sound quality can be improved.

(2) Details

Details of the microphone system 1 of the present embodiment will be described below.

The microphone system 1 includes the microphone 2, a processing unit 3, the power supply circuit 4, a DC/DC converter 30, and a speaker 6.

The microphone 2 is a single-ended analog output Micro Electro Mechanical Systems (MEMS) microphone. The microphone 2 includes, for example, a capacitor with a movable electrode and a fixed electrode. In a case where the movable electrode vibrates due to sound, the electrostatic capacitance between the movable electrode and the fixed electrode changes. The microphone 2 converts the change in the electrostatic capacitance of the capacitor into a voltage signal. Specifically, the microphone 2 includes the microphone output terminal T22, the microphone GND terminal T21, and a microphone power supply terminal T23. A predetermined DC voltage is applied between the microphone power supply terminal T23 and the microphone GND terminal T21. For example, a capacitor is electrically connected between the microphone power supply terminal T23 and the microphone GND terminal T21 via a resistor. For example, the microphone power supply terminal T23 is electrically connected to one of the movable electrode and the fixed electrode of the capacitor via a resistor, the microphone GND terminal T21 is electrically connected to the other of the movable electrode and the fixed electrode, and the microphone output terminal T22 is electrically connected to one of the movable electrode and the fixed electrode. In other words, the microphone output terminal T22 is electrically connected to the microphone power supply terminal T23 via a resistor. According to the configuration described above, the voltage between the microphone output terminal T22 and the microphone GND terminal T21 changes depending on change in the electrostatic capacitance of the capacitor. Note that in the present embodiment, the microphone power supply terminal T23 is electrically connected to the capacitor via a resistor, but the microphone GND terminal T21 may be electrically connected to the other of the movable electrode and the fixed electrode via a resistor, and the microphone output terminal T22 may be electrically connected to the other of the movable electrode and the fixed electrode and to the microphone GND terminal T21 via a resistor.

The microphone 2 outputs, as an input sound signal, a voltage signal indicating a voltage change between the microphone output terminal T22 and the microphone GND terminal T21. The input sound signal is an analog signal with a signal value corresponding to an amplitude value of the voltage between the microphone output terminal T22 and the microphone GND terminal T21.

In the present embodiment, the microphone 2 is a small microphone using MEMS technology and is mounted on a third circuit board B3. The microphone 2 and the third circuit board B3 are relatively small in size and thus provide a relatively high degree of freedom in terms of placement of the home appliance. Thus, the microphone 2 can be placed at a position where the user's voice can be easily acquired.

Note that the microphone 2 is not limited to the configuration described above and may be, for example, an Electret Condenser Microphone (ECM). In a case where the microphone 2 is an ECM, for example, the microphone output terminal T22 is also used as the microphone power supply terminal T23 and is electrically connected to a power supply via a resistor.

A connector CN31a is mounted on the third circuit board B3. The connector CN31a is electrically connected to the microphone power supply terminal T23, the microphone output terminal T22, and the microphone GND terminal T21 of the microphone 2 via a conductor of the third circuit board B3. The connector CN31a is electrically and mechanically connected to a connector CN31b. Hereinafter, the connectors CN31a and CN31b are collectively referred to as a connector CN31.

The connector CN31b is electrically and mechanically connected to one end of each signal line of a pair of second signal lines W20 and to one end of a second microphone power supply line W23. The pair of second signal lines W20 includes a second positive electrode signal line W21 and a second negative electrode signal line W22. By connecting the connector CN31a and the connector CN31b, the second microphone power supply line W23 is electrically connected to the microphone power supply terminal T23, the second positive electrode signal line W21 is electrically connected to the microphone output terminal T22, and the second negative electrode signal line W22 is electrically connected to the microphone GND terminal T21. A connector CN22b is electrically and mechanically connected to the other end of each signal line of the pair of second signal lines W20 and to the other end of the second microphone power supply line W23. The connector CN22b is electrically and mechanically connected to the connector CN22a mounted on the second circuit board B2. Hereinafter, the connectors CN22a and CN22b are collectively referred to as the connector CN22.

The connector CN22a is electrically connected to a connector CN21a mounted on the second circuit board B2 via a conductor of the second circuit board B2. The connector CN21a is electrically and mechanically connected to a connector CN21b. Hereinafter, the connectors CN21a and CN21b are collectively referred to as a connector CN21.

The connector CN21b is electrically and mechanically connected to one end of each signal line of the pair of first signal lines W10 and to one end of the first microphone power supply line W13. The pair of first signal lines W10 includes a first positive electrode signal line W11 and a first negative electrode signal line W12. A connector CN11b is electrically and mechanically connected to the other end of each signal line of the pair of first signal lines W10 and to the other end of the first microphone power supply line W13.

The connector CN11*b* is electrically and mechanically connected to a connector CN11*a* mounted on the first circuit board B1. Hereinafter, the connectors CN11*a* and CN11*b* are collectively referred to as a connector CN11.

The connector CN11*a* is electrically connected to the processing unit 3 mounted on the first circuit board B1 via a conductor of the first circuit board B1.

The processing unit 3 is an integrated circuit, and is configured to be driven by DC power fed from the power supply circuit 4.

The power supply circuit 4 is mounted on the second circuit board B2, and is a DC power supply that outputs DC power. The power supply circuit 4 is, for example, an AC-DC converter including a rectifier circuit, a booster circuit, and a step-down circuit 31, and converts alternating current (AC) power fed from a commercial power supply to DC power. The power supply circuit 4 includes a positive electrode terminal T41 and a negative electrode terminal T42, and generates a predetermined DC voltage (e.g., a DC voltage of 5 V) between the positive electrode terminal T41 and the negative electrode terminal T42. The positive electrode terminal T41 and the negative electrode terminal T42 of the power supply circuit 4 are electrically connected to the connector CN22*a* via a conductor of the second circuit board B2. The negative electrode terminal T42 of the power supply circuit 4 is electrically connected to the circuit GND of the second circuit board B2.

The connector CN21*b* and the connector CN11*b* are electrically and mechanically connected via a pair of power supply lines W30. The pair of power supply lines W30 includes a positive electrode power supply line W31 and a negative electrode power supply line W32.

The power supply circuit 4 is electrically connected to the DC/DC converter 30 mounted on the first circuit board B1 via the connectors CN11 and CN21 and the pair of power supply lines W30. Specifically, the positive electrode terminal T41 of the power supply circuit 4 is electrically connected to the power input terminal of the DC/DC converter 30 via the connectors CN11 and CN21 and the positive electrode power supply line W31. The negative electrode terminal T42 of the power supply circuit 4 is electrically connected to the GND terminal of the DC/DC converter 30 and the circuit GND of the first circuit board B1 via the connectors CN11 and CN21 and the negative electrode power supply line W32. The power supply circuit 4 applies a DC voltage to the DC/DC converter 30.

The DC/DC converter 30 is a constant voltage circuit that outputs a predetermined DC voltage. The DC/DC converter 30 applies a predetermined DC voltage (e.g., a DC voltage of 3.3 V) obtained by reducing the DC voltage applied by the power supply circuit 4. The DC/DC converter 30 applies the generated DC voltage to the processing unit 3.

In other words, a power supply path from the power supply circuit 4 mounted on the second circuit board B2 to the DC/DC converter 30 mounted on the first circuit board B1 and the processing unit 3 includes the connectors CN11 and CN21 and the pair of power supply lines W30 (positive electrode power supply line W31 and negative electrode power supply line W32). Specifically, an output current I1 (direct current) from the power supply circuit 4 sequentially flows through the positive electrode terminal T41 of the power supply circuit 4, the connector CN21, the positive electrode power supply line W31, the connector CN11, the DC/DC converter 30, the processing unit 3, the connector CN11, the negative electrode power supply line W32, the connector CN21, and the negative electrode terminal T42 of the power supply circuit 4 (circuit GND of the second circuit board B2).

In the present embodiment, the processing unit 3 is a System On a Chip (SoC) including a plurality of functional blocks integrally. The processing unit 3 includes the step-down circuit 31, the A/D converting unit 32, the wireless communication unit 33, and a D/A converting unit 34 as a plurality of functional blocks (electrical loads). The processing unit 3 includes a power supply terminal T31, an analog GND terminal T32, and a digital GND terminal T33.

The power supply terminal T31 is electrically connected to an output terminal T34 of the DC/DC converter 30.

The analog GND terminal T32 and the digital GND terminal T33 are electrically connected to the circuit GND of the first circuit board B1. In other words, in the present embodiment, the processing unit 3 includes a common GND used as both an analog GND and a digital GND. This simplifies the circuit configuration of the processing unit 3 and the first circuit board B1. Note that the analog GND and the digital GND for the processing unit 3 may be electrically isolated from each other.

The step-down circuit 31 is a linear regulator, for example, a Low Drop Out (LDO). The step-down circuit 31 outputs a predetermined DC voltage (e.g., a DC voltage of 2 V) obtained by reducing a DC voltage applied by the DC/DC converter 30. The output terminal T34 of the step-down circuit 31 is electrically connected to the microphone power supply terminal T23 of the microphone 2 via the connectors CN11, CN21, CN22, and CN31, the first microphone power supply line W13, and the second microphone power supply line W23. The step-down circuit 31 applies a predetermined DC voltage between the microphone power supply terminal T23 and the microphone GND terminal T21 of the microphone 2. The microphone 2 uses an output voltage from the step-down circuit 31 as a drive voltage.

The A/D converting unit 32 is an Analog to Digital (AD) converting unit that performs digital conversion on an analog signal for conversion into a digital signal. The A/D converting unit 32 receives sound input signals, including analog signals. Specifically, the processing unit 3 further includes a signal input terminal T35. The A/D converting unit 32 is a single-ended input A/D converting unit and is electrically connected to the signal input terminal T35 and the analog GND terminal T32. An input sound signal is input to the A/D converting unit 32 via the input terminal and the analog GND terminal T32.

The signal input terminal T35 is electrically connected to the connector CN11*a* via a capacitor C1 and the conductor of the first circuit board B1. The capacitor C1 blocks the DC component of the sound input signal input to the A/D converting unit 32. The signal input terminal T35 is electrically connected to the microphone output terminal T22 of the microphone 2 via the capacitor C1, the connectors CN11, CN21, CN22, and CN31, the first positive electrode signal line W11, the second positive electrode signal line W21, and conductors of the first to third circuit boards B1 to B3.

The analog GND terminal T32 is electrically connected to the microphone GND terminal T21 of the microphone 2 via the connectors CN11, CN21, CN22, and CN31, the first negative electrode signal line W12, the second negative electrode signal line W22, and conductors of the first to third circuit boards B1 to B3.

Accordingly, the microphone 2 outputs an input sound signal to the A/D converting unit 32 via the pair of first signal lines W10 connecting the first circuit board B1 and the second circuit board B2, and the pair of second signal lines W20 connecting the second circuit board B2 and the third circuit board B3. In other words, the signal path of the input sound signal includes the pair of first signal lines W10 connecting the first circuit board B1 and the second circuit board B2, and the pair of second signal lines W20 connecting the second circuit board B2 and the third circuit board B3.

The A/D converting unit 32 generates sound data by performing digital conversion (e.g., quantization) on the input sound signal that is input. Specifically, the A/D converting unit 32 samples the voltage value (amplitude of the input sound signal) between the analog GND terminal T32 and the signal input terminal T35 at a predetermined period, and generates sound data by converting the voltage value to a digital value. The A/D converting unit 32 outputs the generated sound data to the wireless communication unit 33.

The wireless communication unit 33 is a communication interface that transmits and/or receives wireless signals. The wireless communication unit 33 is configured to perform wireless communication conforming to communication standards, for example, Wi-Fi (trade name). The wireless communication unit 33 transmits and/or receives wireless signals through an antenna mounted on the first circuit board B1. The wireless communication unit 33 transmits the sound data to the voice processing unit 51 provided on the server 5. Specifically, the wireless communication unit 33 is configured to enable transmission and/or reception of wireless signals to and from the communication terminal 50. The communication terminal 50 is, for example, a router, a modem, or a gateway. The communication terminal 50 is connected to a communication line NT1, for example, an Internet line. The communication terminal 50 is configured to be able to communicate with the server 5 over the communication line NT1. The wireless communication unit 33 transmits sound data to the voice processing unit 51 of the server 5 via the communication terminal 50. Note that, in the present embodiment, the sound data generated by the A/D converting unit 32 is temporarily stored in the memory. The wireless communication unit 33 intermittently transmits sound data for a predetermined amount of time (e.g., several seconds) in a batch. The sound data transmitted to the wireless communication unit 33 may be the sound data generated by the A/D converting unit 32 and unchanged, the sound data subjected to sound processing such as noise removal, or the sound data subjected to compression processing to reduce the amount of communication.

The voice processing unit 51 performs voice recognition processing on the received sound data. Then, the voice processing unit 51 transmits sound data of a response voice for a voice recognition processing result and a control instruction for the home appliance, and the like, to the wireless communication unit 33 via the communication line NT1 and the communication terminal 50. In other words, the wireless communication unit 33 receives a wireless signal including sound data for a response voice, a control instruction, and the like. The control unit of the home appliance controls the home appliance based on the control instruction.

The D/A converting unit 34 is a Digital to Analog (D/A) converter that performs analog conversion on a digital signal for conversion into an analog signal. The D/A converting unit 34 converts the sound data (digital signal) included in the wireless signal received by the wireless communication unit 33 into an analog signal. The D/A converting unit 34 amplifies the analog signal by using, for example, an amplifier, and outputs the amplified analog signal as an output sound signal to the speaker 6 (electric load). Accordingly, the speaker 6 is driven by the D/A converting unit 34 using, as driving power, the DC power fed from the power supply circuit 4.

The speaker 6 is electrically connected to the D/A converting unit 34 via a pair of speaker signal lines W40, the connector CN11, and a pair of sound output terminals T36 and T37. The speaker 6 outputs sound corresponding to an output sound signal that is input. For example, the speaker 6 generates a response voice to the voice emitted by the user. Note that the speaker 6 may be mounted on the third circuit board B3 along with the microphone 2. In this case, the speaker 6 may be connected to the D/A converting unit 34 via the connectors CN11, CN21, CN22, and CN31 similarly to the microphone 2.

(3) Operation Examples

Figure 3:
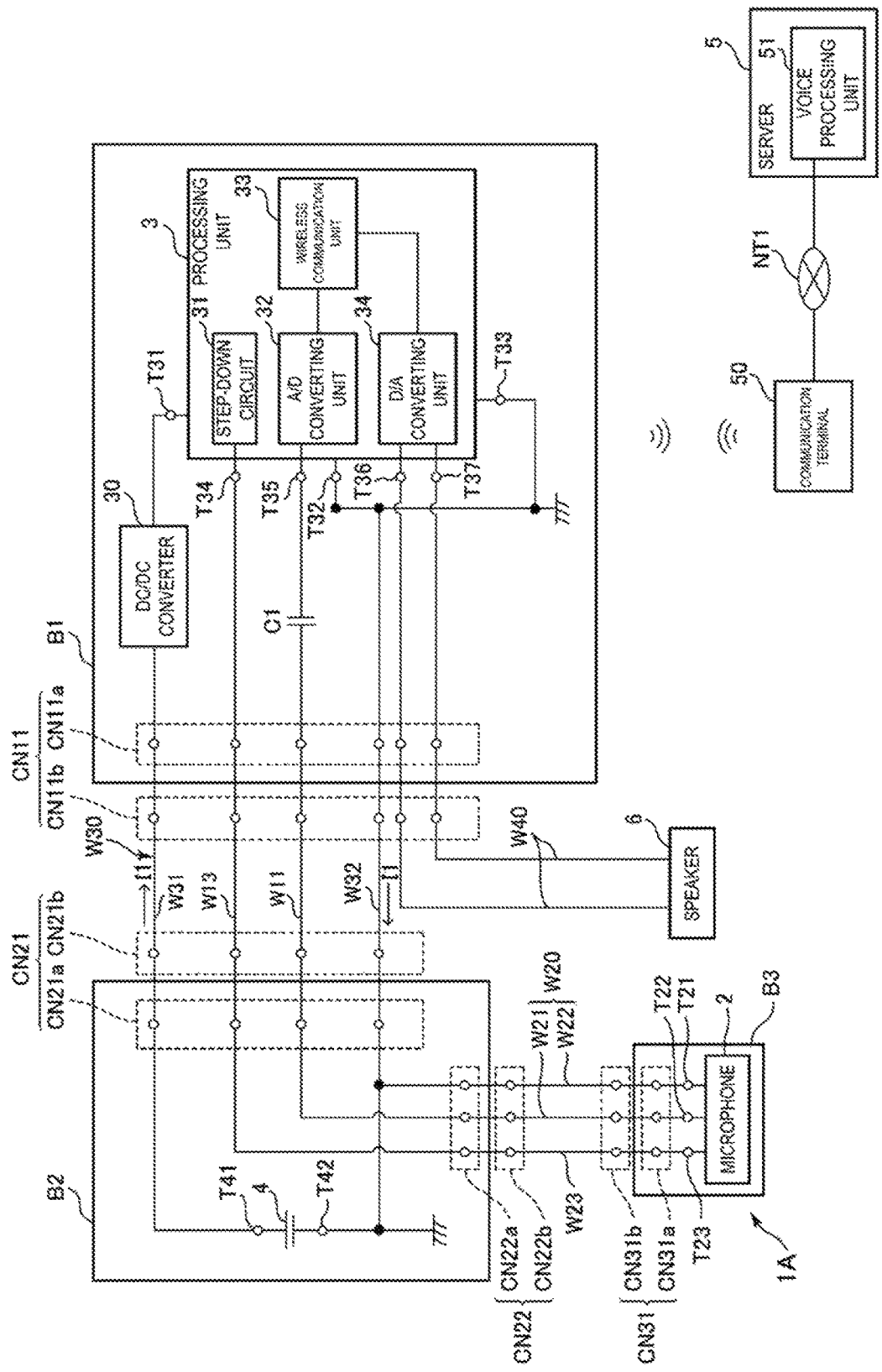
FIG. 3 is a block diagram of a microphone system in a comparative example.
Figure 4:
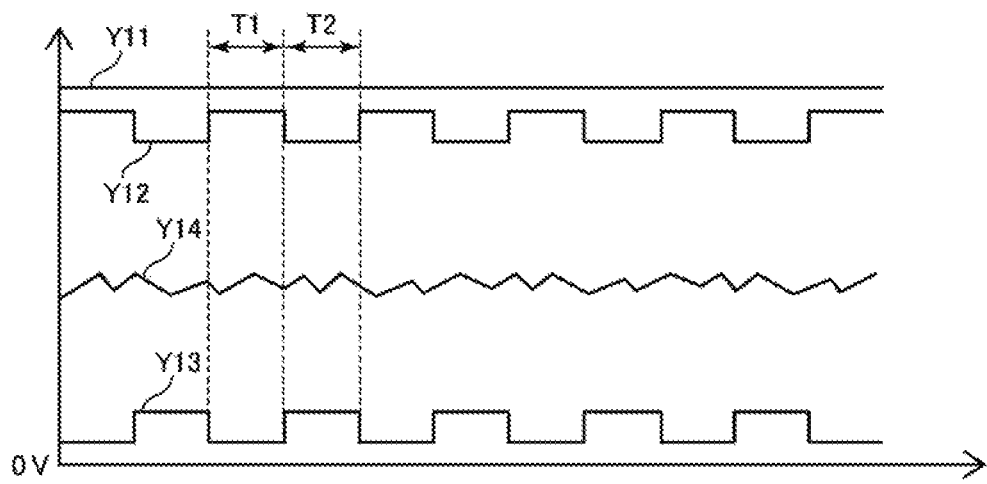
FIG. 4 is an operational waveform diagram of the microphone system in the comparative example.

Now, an example of operation of the microphone system 1 of the present embodiment will be described with reference to FIGS. 2 to 4. FIG. 2 is an operational waveform diagram of the microphone system 1 according to the present embodiment. FIG. 3 is a block diagram of a microphone system 1A in a comparative example. FIG. 4 is an operational waveform diagram of the microphone system 1A in the comparative example.

The microphone system 1A in the comparative example differs in that, in the second circuit board B2, the microphone GND terminal T22 of the microphone 2 is electrically connected to the negative electrode terminal T42 of the power supply circuit 4 (circuit GND of the second circuit board B2). In the microphone system 1A in the comparative example, the first negative electrode signal line W12 is omitted, and the negative electrode power supply line W32 serves both as the path of the output current I1 from the power supply circuit 4 and as the signal path of an input sound signal. Components of the microphone system 1A in the comparative example that are similar to the corresponding components of the microphone system 1 of the present embodiment are denoted by the same reference signs, and descriptions the components will be omitted as appropriate.

As described above, in the microphone system 1 of the present embodiment, the signal path of the input sound signal output by the microphone 2 is electrically isolated from the path of the output current I1 from the power supply circuit 4. Specifically, the microphone GND terminal T21 of the microphone 2 is electrically connected to the A/D converting unit 32 via the connectors CN11, CN21, CN22, and CN31, the first negative electrode signal line W12, the second negative electrode signal line W22, and the conductors of the first to third circuit boards B1 to B3. The negative electrode terminal T42 of the power supply circuit 4 is electrically connected to the A/D converting unit 32 via the connectors CN11 and CN21, the negative electrode power supply line W32, and the conductors of the first and second circuit boards B1 and B2.

Strictly speaking, the conductor of the first circuit board B1 (the circuit GND of the first circuit board B1) is used commonly for the signal path of the input sound signal and for the path of the output current I1. In other words, the microphone GND terminal T21 of the microphone 2 is electrically connected to the negative electrode terminal T42 of the power supply circuit 4 via the first and second negative electrode signal lines W12 and W22, the conductor of the first circuit board B1, and the negative electrode power supply line W32. However, in the second circuit board B2, the microphone GND terminal T21 of the microphone 2 and the negative electrode terminal T42 of the power supply circuit 4 are electrically isolated (not connected). Accordingly, the output current I1 does not flow through the first negative electrode signal line W12. More precisely, some of the output current I1 flows through the first negative electrode signal line W12 as a drive current for the microphone 2. However, the drive current for the microphone 2 is sufficiently small compared to the output current I1, and thus is neglected here.

Here, the path of the output current I1 from the power supply circuit 4 includes the pair of power supply lines W30 and the connectors CN11 and CN21. Accordingly, voltage drop occurs due to wiring resistance of the pair of power supply lines W30, contact resistance of the connectors CN11 and CN21, and the like. The magnitude of the voltage drop varies depending on the magnitude of the output current I1. For example, the current consumption of the wireless communication unit 33, that is, the output current I1 is larger during a wireless transmission period in which the wireless communication unit 33 transmits a wireless signal than during a steady period when the wireless communication unit 33 transmits no wireless signal. Thus, the voltage drop at the pair of power supply lines W30 and the connectors CN11, CN21 is larger during wireless transmission than during the steady state.

FIG. 2 is a voltage waveform diagram of the microphone system 1 based on the potential of the negative electrode terminal T42 of the power supply circuit 4 (circuit GND of the second circuit board B2). In FIG. 2, Y1 is a voltage waveform of the positive electrode terminal T41 of the power supply circuit 4, Y2 is a voltage waveform of the positive electrode input terminal of the DC/DC converter 30, Y3 is a voltage waveform of the analog GND terminal T32 of the processing unit 3 (circuit GND of the first circuit board B1), and Y4 is a voltage waveform of the signal input terminal T35 of the processing unit 3.

As illustrated at Y1 and Y2 in FIG. 2, the potential of the positive electrode input terminal of the DC/DC converter 30 is lower than the potential of the positive electrode terminal T41 of the power supply circuit 4 due to voltage drop caused by wiring resistance of the positive electrode power supply line W31 or contact resistance of the connectors CN11 and CN21. The potential of the positive electrode input terminal of the DC/DC converter 30 is lower during a wireless transmission period T2 when the wireless communication unit 33 is in operation than during a steady period T1 when the wireless communication unit 33 is stopped.

As illustrated at Y3 in FIG. 2, the potential of the analog GND terminal T32 (circuit GND of the first circuit board B1) is higher than the potential of the negative electrode terminal T42 of the power supply circuit 4 (circuit GND of the second circuit board B2) due to voltage drop caused by wiring resistance of the negative electrode power supply line W32 or contact resistance of the connectors CN11 and W32. The potential of the analog GND terminal T32 is higher during the wireless transmission period T2 than during the steady period T1.

In other words, a potential difference occurs between the circuit GND of the first circuit board B1 and the circuit GND of the second circuit board B2. The potential of the circuit GND of the first circuit board B1 varies depending on the magnitude of the output current I1.

In the microphone system 1 of the present embodiment, the microphone GND terminal T21 of the microphone 2 is electrically connected to the circuit GND of the first circuit board B1 via the first and second negative electrode signal lines W12 and W22. The microphone outputs the input sound signal by using the circuit GND of the first circuit board B1 as a reference potential. Accordingly, as illustrated at Y4 in FIG. 2, the input waveform of the signal input voltage fluctuates in conjunction with the potential of the circuit GND of the first circuit board B1 (see Y3 in FIG. 2). As illustrated in FIG. 2, the upper limit value of the potential of the signal input terminal T35 during the steady period T1 is V1, whereas, during the wireless transmission period T2, the upper limit value of the potential of the signal input terminal T35 increases to V2 due to an increased potential of the circuit GND of the first circuit board B1 (>V1).

The A/D converting unit 32 receives, as an input sound signal, a potential difference between the potential of the analog GND terminal T32 (the circuit GND of the first circuit board B1, see Y3 in FIG. 2) and the potential of the signal input terminal T35 (see Y2 in FIG. 2). In the microphone system 1 of the present embodiment, the input sound signal is a voltage signal where the circuit GND of the first circuit board B1 is used as a reference potential. Thus, even in a case where the potential of the circuit GND of the first circuit board B1 varies with respect to the potential of the circuit GND of the second circuit board B2 due to wiring resistance or contact resistance, the amplitude of the input sound signal (the potential difference between the potential of the signal input terminal T35 and the potential of the analog GND terminal T32) is unlikely to be affected by fluctuations in the circuit GND of the first circuit board B1. In other words, the input sound signal is unlikely to be affected by noise due to fluctuations in the circuit GND of the first circuit board B1. Accordingly, the sound quality of the microphone system 1 of the present embodiment can be improved.

On the other hand, in the microphone system 1A in the comparative example, the microphone GND terminal T21 of the microphone 2 is electrically connected to the circuit GND of the second circuit board B2 in the second circuit board B2. In other words, in the microphone system 1A in the comparative example, the microphone 2 outputs the input sound signal by using the circuit GND of the second circuit board B2 as the reference potential.

FIG. 4 is a voltage waveform diagram of the microphone system 1A in the comparative example based on the potential of the negative electrode terminal T42 of the power supply circuit 4 (circuit GND of the second circuit board B2). In FIG. 4, Y11 is a voltage waveform of the positive electrode terminal T41 of the power supply circuit 4, Y12 is a voltage waveform of the positive electrode input terminal of the DC/DC converter 30, Y13 is a voltage waveform of the analog GND terminal T32 of the processing unit 3 (circuit GND of the first circuit board B1), and Y14 is a voltage waveform of the signal input terminal T35 of the processing unit 3. Y11 to Y13 in FIG. 4 are similar to Y1 to Y3 in FIG. 2, respectively.

In the microphone system 1A in the comparative example, the input sound signal is a voltage signal where the circuit GND of the second circuit board B2 is used as a reference potential. Accordingly, as illustrated in FIG. 4 at Y14, the input waveform of the signal input voltage does not fluctuate in conjunction with the potential of the circuit GND of the first circuit board B1 (see Y13 in FIG. 4). However, the A/D converting unit 32 receives, as an input sound signal, a potential difference between the potential of the analog GND terminal T32 (the circuit GND of the first circuit board B1, see Y13 in FIG. 4) and the potential of the signal input terminal T35 (see Y12 in FIG. 4). Thus, in the microphone system 1A in the comparative example, in a case where the potential of the circuit GND of the first circuit board B1 varies with respect to the potential of the circuit GND of the second circuit board B2 due to wiring resistance or the contact resistance, the amplitude of the input sound signal varies in conjunction with the fluctuation in the circuit GND of the first circuit board B1. Thus, in the microphone system 1A in the comparative example, during the wireless transmission period T2, the potential of the circuit GND of the first circuit board B1 is higher than during the steady period T1, leading to a reduced amplitude of the input sound signal. For example, in a case where the period (T1+T2) of the wireless transmission period and the wireless deactivation period corresponds to an audible band, noise is heard when the sound data is reproduced, and this degrades sound quality.

As described above, the microphone system 1 of the present embodiment is less likely to be affected by noise caused by fluctuations in the circuit GND of the first circuit board B1 and possible noise during reproduction of the sound data is reduced, which allows the sound quality to be improved.

The microphone system 1 of the present embodiment does not require a capacitor with a large capacity that suppresses fluctuations in the circuit GND of the first circuit board B1, thus enabling a reduction in the size of the first circuit board B1. In other words, the size of the microphone system 1 can be reduced. The degree of freedom of arrangement of the first circuit board B1 is improved. Thus, the communication environment for wireless communication by the wireless communication unit 33 is easily disposed in a preferred position.

In the microphone system 1 of the present embodiment, the processing unit 3 does not need to electrically isolate the analog GND from the digital GND, allowing the circuit configuration to be simplified.

Note that in the example described above, the fluctuation in the circuit GND of the first circuit board B1 due to the transmission/deactivation of the wireless signal by the wireless communication unit 33 has been described, but the circuit GND of the first circuit board B1 also fluctuates due to driving/deactivation of another electrical load. For example, because the output current I1 increases and decreases due to the sound emission/deactivation of the speaker 6, the circuit GND of the first circuit board B1 fluctuates. In the microphone system 1 of the present embodiment, the input sound signal is less likely to be affected by fluctuations in the circuit GND of the first circuit board B1, thus allowing sound quality to be improved.

In the example described above, the microphone 2 is mounted on the third circuit board B3. However, the embodiment is not limited to this configuration and, for example, the microphone 2 may be mounted on the second circuit board B2.

The signal path of the input sound signal output by the microphone 2 includes the conductor of the second circuit board B2. However, the embodiment is not limited to this configuration. For example, the microphone 2 may be configured to output the input sound signal to the A/D converting unit 32 via a pair of signal lines that electrically and mechanically connect the first circuit board B1 and the third circuit board B3.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A microphone system comprising:
a microphone including a microphone output terminal and a microphone GND terminal, the microphone being configured to output, as an input sound signal, a voltage signal exhibiting a change in voltage between the microphone output terminal and the microphone GND terminal depending on an input sound;
an A/D converting unit mounted on a first circuit board and configured to perform digital conversion on the input sound signal that is input; and
a power supply circuit mounted on a second circuit board connected to the first circuit board via a pair of power supply lines, and configured to feed DC power to the A/D converting unit via the pair of power supply lines,
wherein the microphone outputs the input sound signal to the A/D converting unit via a pair of first signal lines different from the pair of power supply lines.

2. The microphone system according to claim 1,
wherein the microphone GND terminal of the microphone is electrically connected to a negative electrode terminal of the power supply circuit via a first negative electrode signal line of the pair of first signal lines, a conductor of the first circuit board, and a negative electrode power supply line of the pair of power supply lines.

3. The microphone system according to claim 1,
wherein the microphone further includes a microphone power supply terminal, and
the microphone power supply terminal is electrically connected to a positive electrode terminal of the power supply circuit via a microphone power supply line connected to the first circuit board, a conductor of the first circuit board, and a positive electrode power supply line of the pair of power supply lines.

4. The microphone system according to claim 1,
wherein the microphone is mounted on a third circuit board connected to the second circuit board via a pair of second signal lines, the microphone being configured to output the input sound signal to the A/D converting unit via the pair of second signal lines, a conductor of the second circuit board, and the pair of first signal lines.

5. The microphone system according to claim 1,
wherein the power supply circuit feeds DC power to an electrical load different from the A/D converting unit via the pair of power supply lines.

6. The microphone system according to claim 5,
wherein the electrical load includes a wireless communication unit mounted on the first circuit board, and
the wireless communication unit transmits a wireless signal including sound data obtained through the A/D converting unit performing digital conversion on the input sound signal.

7. The microphone system according to claim 6,
wherein the electrical load further includes:
a D/A converting unit configured to generate an output sound signal obtained by performing analog conversion on sound data included in the wireless signal received by the wireless communication unit, and
a speaker configured to output sound corresponding to the output sound signal.

\* \* \* \* \*